United States Patent
Lee et al.

(10) Patent No.: US 8,946,751 B2
(45) Date of Patent: Feb. 3, 2015

(54) SEMICONDUCTOR LIGHT EMITTING DEVICE

(71) Applicant: Samsung Electronics Co., Ltd., Suwon-si, Gyeonggi-do (KR)

(72) Inventors: Jin Bock Lee, Gyeonggi-do (KR); Ki Seok Kim, Gyeonggi-do (KR); Je Won Kim, Seoul (KR); Ju-Bin Seo, Seoul (KR); Seong Seok Yang, Gyeonggi-do (KR); Sang Seok Lee, Seoul (KR); Joon Sub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/015,095

(22) Filed: Aug. 30, 2013

(65) Prior Publication Data

US 2014/0070252 A1 Mar. 13, 2014

(30) Foreign Application Priority Data

Sep. 7, 2012 (KR) ........................ 10-2012-0099584

(51) Int. Cl.
| | | |
|---|---|---|
| H01L 33/00 | (2010.01) | |
| H01L 33/36 | (2010.01) | |
| H01L 33/10 | (2010.01) | |
| H01L 33/60 | (2010.01) | |
| H01L 33/42 | (2010.01) | |
| H01L 33/38 | (2010.01) | |
| H01L 33/40 | (2010.01) | |

(52) U.S. Cl.
CPC ............... *H01L 33/36* (2013.01); *H01L 33/10* (2013.01); *H01L 33/60* (2013.01); *H01L 33/38* (2013.01); *H01L 33/405* (2013.01); *H01L 33/42* (2013.01)
USPC ............................................. 257/98; 257/103

(58) Field of Classification Search
CPC ........ H01L 33/38; H01L 33/42; H01L 33/405; H01L 33/60; H01L 33/10
USPC ...................................................... 257/98, 103
See application file for complete search history.

(56) References Cited

U.S. PATENT DOCUMENTS

| | | | |
|---|---|---|---|
| 2009/0072249 A1* | 3/2009 | Fudeta ............................. | 257/88 |
| 2011/0215356 A1* | 9/2011 | Ogawa et al. .................... | 257/98 |
| 2013/0153948 A1* | 6/2013 | Yasuda et al. ................... | 257/98 |
| 2014/0042480 A1* | 2/2014 | Moon et al. ..................... | 257/98 |
| 2014/0110746 A1* | 4/2014 | LIM et al. ........................ | 257/99 |

FOREIGN PATENT DOCUMENTS

| | | |
|---|---|---|
| JP | 2002246173 | 8/2002 |
| JP | 2008244387 | 10/2008 |
| KR | 1020040069011 | 8/2004 |
| KR | 1020080072555 | 8/2008 |

\* cited by examiner

*Primary Examiner* — Ngan Ngo
(74) *Attorney, Agent, or Firm* — F. Chau & Associates, LLC

(57) ABSTRACT

A semiconductor light emitting device includes a first conductivity-type semiconductor layer, an active layer and a second conductivity-type semiconductor layer sequentially stacked on a substrate. A first electrode is disposed on a portion of the first conductivity-type semiconductor layer. A current diffusion layer is disposed on the second conductivity-type semiconductor layer and includes an opening exposing a portion of the second conductivity-type semiconductor layer. A second electrode covers a portion of the current diffusion layer and the exposed portion of the second conductivity-type semiconductor layer, wherein the portion of the current diffusion layer is near the opening.

18 Claims, 17 Drawing Sheets

US 8,946,751 B2

SEMICONDUCTOR LIGHT EMITTING DEVICE

CROSS-REFERENCE TO RELATED APPLICATIONS

This application claims priority under 35 U.S.C. §119 to Korean Patent Application No. 10-2012-0099584 filed on Sep. 7, 2012, in the Korean Intellectual Property Office, the disclosure of which is incorporated by reference herein in its entirety.

TECHNICAL FIELD

The present invention relates to a method of manufacturing a semiconductor light emitting device and a semiconductor light emitting device manufactured thereby.

DISCUSSION OF RELATED ART

Semiconductor light emitting devices provide light of various colors through electron-hole recombination occurring at p-n junctions between p-type and n-type semiconductor layers when current is applied thereto. Semiconductor light emitting devices have a relatively longer lifespan, lower power consumption, better initial-operating characteristics, and higher vibration resistance over filament-based light emitting devices. Semiconductor light emitting devices may include group III nitride semiconductors that can emit light having a blue/short wavelength.

SUMMARY OF THE INVENTION

According to an exemplary embodiment of the inventive concept, a semiconductor light emitting device includes a first conductivity-type semiconductor layer, an active layer and a second conductivity-type semiconductor layer sequentially stacked on a substrate. A first electrode is disposed on a portion of the first conductivity-type semiconductor layer. A current diffusion layer is disposed on the second conductivity-type semiconductor layer and includes an opening exposing a portion of the second conductivity-type semiconductor layer. A second electrode covers a portion of the current diffusion layer and the exposed portion of the second conductivity-type semiconductor layer, wherein the portion of the current diffusion layer is near the opening.

According to an exemplary embodiment of the inventive concept, a semiconductor light emitting device includes a substrate. A first conductivity-type semiconductor layer, having a stepped surface, is disposed on the substrate. An active layer is disposed on an upper level of the stepped surface. A second conductivity-type semiconductor layer disposed on the active layer. A current diffusion layer is disposed on the second conductivity and includes a first opening and a second opening, wherein the first and the second openings exposes the second conductivity-type semiconductor layer. A first electrode is disposed on a lower level of the stepped surface. A second electrode is disposed on the second conductivity-type semiconductor layer through the first and the second openings and partially covers the current diffusion layer near the first and the second openings.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
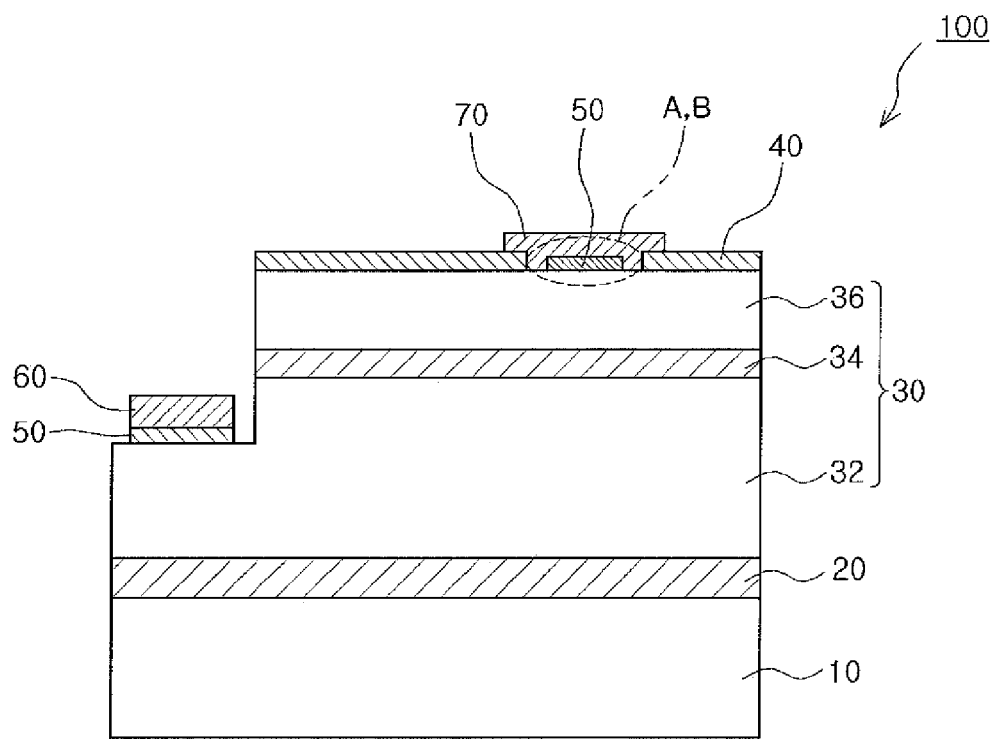
FIG. 1 is a schematic cross-sectional view of a semiconductor light emitting device according to an exemplary embodiment of the inventive concept.

Exemplary embodiments of the inventive concept will be described below in more detail with reference to the accompanying drawings. However, the inventive concept may be embodied in different forms and should not be construed as limited to the embodiments set forth herein. In the drawings, the thickness of layers and regions may be exaggerated for clarity. It will also be understood that when a layer is referred to as being "on" another layer or substrate, it may be directly on the other layer or substrate, or intervening layers may also be present. Like reference numerals may refer to the like elements throughout the specification and drawings.

Figure 2:
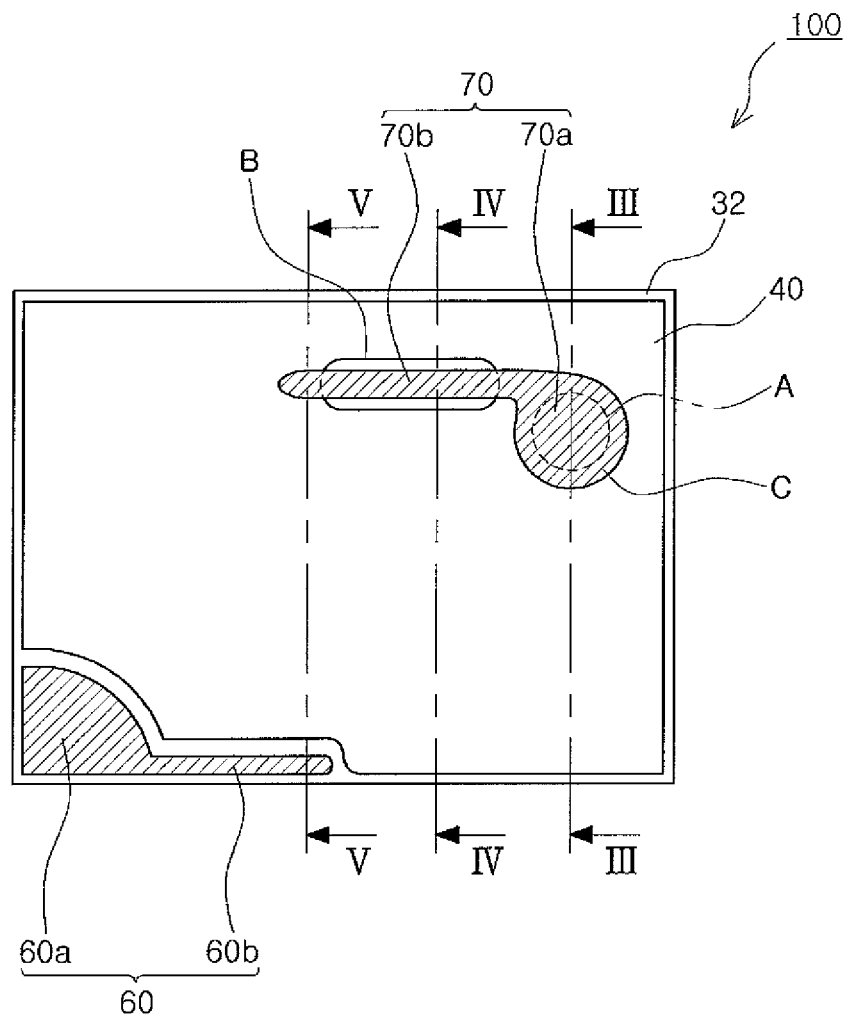
FIG. 2 is a schematic plan view of the semiconductor light emitting device of FIG. 1.

FIG. 1 is a schematic cross-sectional view of a semiconductor light emitting device according to an exemplary embodiment of the inventive concept, and FIG. 2 is a schematic plan view of the semiconductor light emitting device of FIG. 1.

With reference to FIGS. 1 and 2, a semiconductor light emitting device 100 includes a substrate 10, a buffer layer 20, and a light emitting structure 30. The light emitting structure 30 includes a first conductivity-type semiconductor layer 32, an active layer 34 and a second conductivity-type semiconductor layer 36. A first electrode 60 is disposed on a surface of the first conductivity-type semiconductor layer 32. A current diffusion layer 40 and a second electrode 70 are disposed on a surface of the second conductivity-type semiconductor layer 36.

A reflective layer 50 is formed under the first electrode 60 and the second electrode 70.

The substrate 10 may include sapphire, SiC, $MgAl_2O_4$, MgO, $LiAlO_2$, $LiGaO_2$, GaN or the like. For example, a sapphire substrate includes a crystal structure having Hexa-Rhombo R3c symmetry and a lattice constant of 13.001□ in a C-axis and a lattice constant of 4.758□ in an A-axis. The crystal structure of the sapphire substrate includes a C (0001) plane, an A (1120) plane, an R (1102) plane, etc. The C plane may be used as a seed layer for growing a nitride film which is stable at high temperatures.

The buffer layer 20 serves to reduce the number of lattice defects in the light emitting structure 30 when the first conductivity-type semiconductor 32 is grown on the substrate 10. The buffer layer 20 may include an undoped semiconductor layer including nitride or the like. For example, the buffer layer 20 serves to relax lattice constant mismatch between a sapphire substrate 10 and the first conductivity-type semiconductor layer 32 including a gallium nitride (GaN) semiconductor layer. The buffer layer 20 may include an undoped GaN layer, an undoped aluminum nitride (AlN) layer, an undoped indium gallium nitride (InGaN) layer, or the like and may be grown to have a thickness of tens of to hundreds of Å at a relatively low temperature of about 500° C. to about 600° C. In this case, the "undoped" semiconductor layer refers to a semiconductor layer not intentionally doped with any dopant, but there may be some dopants inevitably included therein. For example, when a GaN semiconductor layer is grown by a metal organic chemical vapor deposition (MOCVD) process, dopants, such as silicon (Si) or the like, may be present in the semiconductor layer at a concentration of about $10^{14}/cm^3$ to about $10^{18}/cm^3$.

The first and second conductivity-type semiconductor layers 32 and 36 may be n-type and p-type semiconductor layers, respectively, and may include nitride semiconductors. The terms 'first conductivity-type' and 'second conductivity-type' refer to 'n-type' and 'p-type,' respectively; however, the invention is not limited thereto. The first and second conductivity-type semiconductor layers 32 and 36 may have a composition formula of $Al_xIn_yGa(1-x-y)N$ ($0 \le x \le 1$, $0 \le y \le 1$, $0 \le x+y \le 1$). For example, materials such as GaN, AlGaN, InGaN or the like may be used therefor. The active layer 34, formed between the first and second conductivity-type semiconductor layers 32 and 36, emits light having a predetermined level of energy through electron-hole recombination. The active layer 34 may have a multi-quantum well (MQW) structure in which quantum well layers and quantum bather layers are alternately stacked. For example, an InGaN/GaN structure may be used.

The current diffusion layer 40 formed on the second conductivity-type semiconductor layer 36 may include a transparent conductive oxide, such as indium tin oxide (ITO), Cu-doped indium oxide (CIO), zinc oxide (ZnO) or the like, having a high light transmissivity and a low ohmic contact resistance.

In an exemplary embodiment, the current diffusion layer 40 includes a pad opening A and a finger opening B exposing the corresponding portions of the second conductivity-type semiconductor layer 36. The second electrode 70 is in contact with the exposed portions of the second conductivity-type semiconductor layer 36 through the pad opening A and the finger opening B. The pad opening A and the finger opening B will be described in detail below.

The first and the second electrodes 60 and 70 may be in contact with a conductive wire, a solder bump or the like and serve to apply external electrical signals to the light emitting structure 30. The first and the second electrodes 60 and 70 may include a light reflective material such as Au, Ag, Al, Cu, Ni, or the like, and may have a multilayer structure such as Cr/Au, Ti/Au, or the like. In this case, the first electrode 60 is formed on a portion of an upper surface of the first conductivity-type semiconductor layer 32. The upper surface of the first conductivity-type semiconductor layer 32 is provided by removing portions of the active layer 34 and the second conductivity-type semiconductor layer 36. The second electrode 70 is formed on the second conductivity-type semiconductor layer 36.

As shown in FIG. 2, the first and the second electrodes 60 and 70 include pad portions 60a and 70a and finger portions 60b and 70b, respectively. The finger portions 60b and 70b are extended from the pad portions 60a and 70a and are narrower than the pad portions 60a and 70a. The finger portions 60b and 70b serves to uniformly spread current over the light emitting structure 30. For example, the first electrode 60 includes a first pad portion 60a and a first finger portion 60b extending toward a second pad portion 70a, and the second electrode 70 includes the second pad portion 70a and a second finger portion 70b extending toward the first pad portion 60a. In this case, the first pad portion 60a and the first finger portion 60b are formed along an edge of the upper surface of the first conductivity-type semiconductor layer 32.

Figure 3:
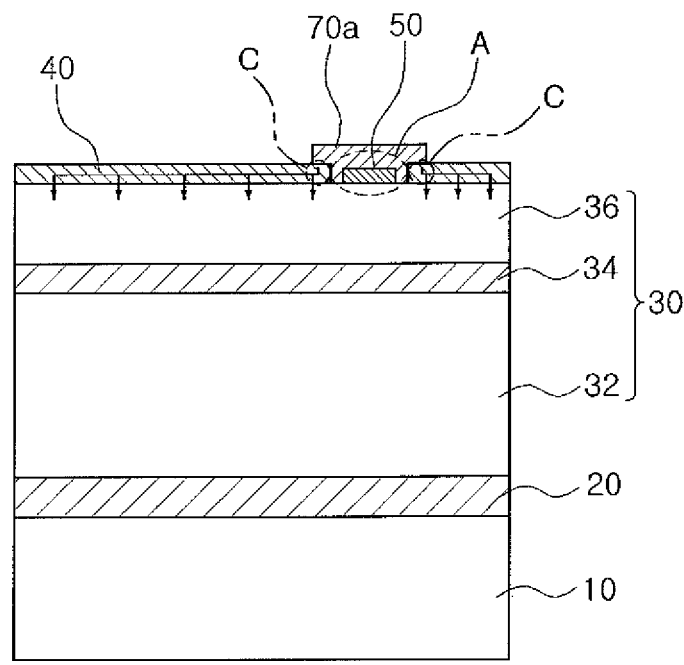
FIG. 3 is a cross-sectional view taken along line III-Ill of FIG. 2.

FIG. 3 is a cross-sectional view taken along line of FIG. 2.

As shown in FIGS. 2 and 3, the second pad portion 70a of the second electrode 70 is larger than the pad opening A of the current diffusion layer 40 and covers the portion of the second conductivity-type semiconductor layer 36 exposed by the pad opening A of the current diffusion layer 40 and a portion of the current diffusion layer 40 near the pad opening A.

Therefore, the second pad portion 70a of the second electrode 70 is in contact the current diffusion layer 40 in an area C around the circumference of the pad opening A of the current diffusion layer 40. In an exemplary embodiment, the second pad portion 70a may have various sizes of contact area. Since the second pad portion 70a is in contact with the current diffusion layer 40 and the exposed portion of the second conductivity-type semiconductor layer 36, current flowing from the second electrode 70 to the second conductivity-type semiconductor layer 36 is spread by the current diffusion layer 40.

For example, the current is uniformly spread in a lateral direction through the current diffusion layer 40 and is prevented from being concentrated (or crowded) in a lower area of the second pad portion 70a of the second electrode 70 which is in contact with the second conductivity-type semiconductor layer 36. This current spreading serves to increase light uniformity of the semiconductor light emitting device 100 and to reduce heat due to current crowding in the lower area of the second pad portion 70a. Therefore, the semiconductor light emitting device has increased reliability and luminance of the semiconductor light emitting device 100.

The reflective layer 50 is formed between the second conductivity-type semiconductor layer 36 and the second pad portion 70a and serves to prevent light emitted from the active layer from being absorbed by the electrodes 60 and 70.

As shown in FIG. 2, the second finger portion 70b of the second electrode 70 is in contact with the current diffusion layer 40 and a portion of the second conductivity-type semiconductor layer 36 exposed by the opening B of the current diffusion layer 40. For example, the second finger portion 70b of the second electrode 70 is narrower than that the finger opening B of the current diffusion layer 40, and the second finger portion 70b of the second electrode 70 is longer than the finger opening B of the current diffusion layer 40.

Figure 4:
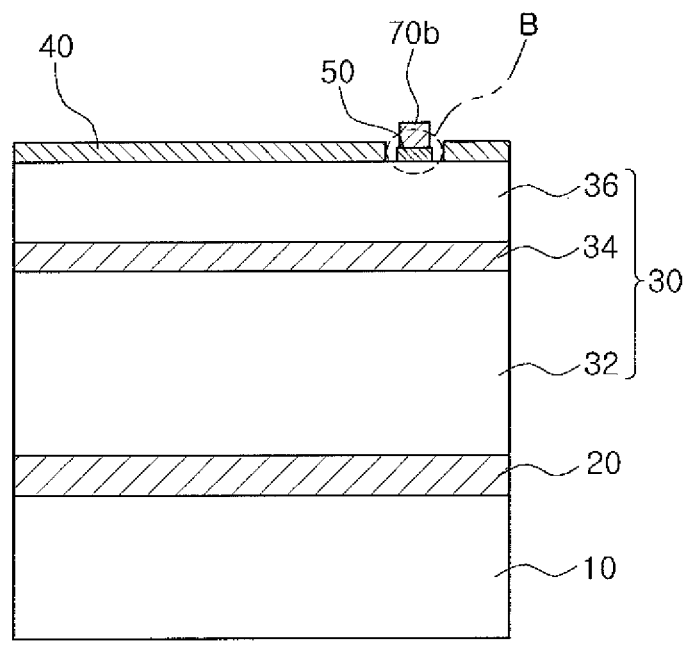
FIG. 4 is a cross-sectional view taken along line IV-IV of FIG. 2.

FIG. 4 is a cross-sectional view taken along line IV-IV of FIG. 2.

As shown in FIG. 4, the second finger portion 70b of the second electrode 70 is formed within the finger opening B of the current diffusion layer 40, and the second finger portion 70b of the second electrode 70 is spaced apart from the current diffusion layer 40 in the IV-IV area of FIG. 2. Therefore, current flows to the second conductivity-type semiconductor layer through the second finger portion 70b without the current diffusion layer 40 spreading the current in a first direction crossing a direction that the second finger portion 70b is extended in the area B shown in FIG. 4.

Figure 5:
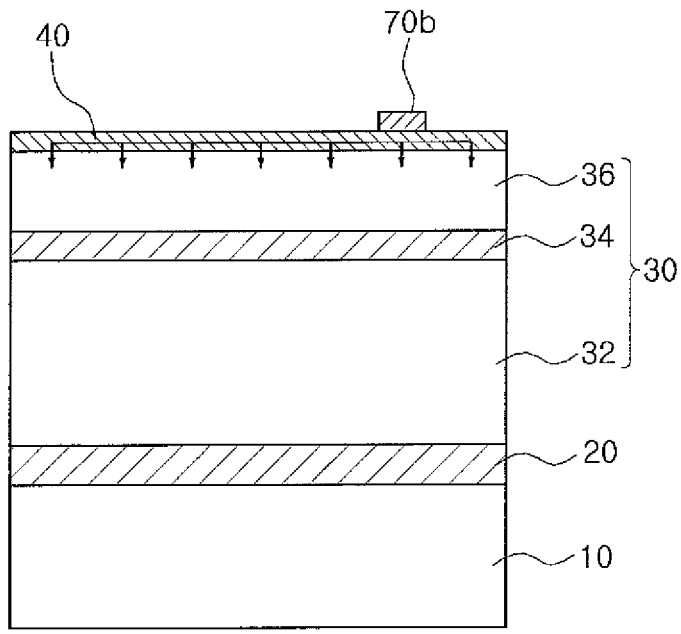
FIG. 5 is a cross-sectional view taken along line V-V of FIG. 2.

FIG. 5 is a cross-sectional view taken along line V-V of FIG. 2.

As shown in FIG. 2, the second finger portion 70b of the second electrode 70 is longer than the finger opening B of the current diffusion layer 40, and accordingly, as shown in FIG. 5, the current diffusion layer 40 is in contact with an end portion of the second finger portion 70b of the second electrode 70.

The second finger portion 70b of the second electrode 70 has the end portion in contact with the current diffusion layer 40, and the current diffusion layer 40 serves to spread the current directed to the second conductivity-type semiconductor layer 36 through the end portion of the second finger portion 70b.

For example, the current is uniformly spread in a lateral direction through the current diffusion layer 40 and is prevented from being concentrated in a lower area of the second finger portion 70b of the second electrode 70 which is in contact with the second conductivity-type semiconductor layer 36. This current spreading serves to increase light uniformity of the semiconductor light emitting device and to reduce heat due to current crowding in the lower area of the second finger portion 70b. Therefore, the semiconductor light emitting device has increased reliability and luminance of the semiconductor light emitting device. In addition, the semiconductor light emitting device operates at a lower operating voltage due to the increased luminance.

Hereinafter, a method of manufacturing a semiconductor light emitting device according to an exemplary embodiment will be described. FIGS. 6 through 25 are cross-sectional or plan views illustrating a method of manufacturing a semiconductor light emitting device according to an exemplary embodiment of the inventive concept.

Figure 6:
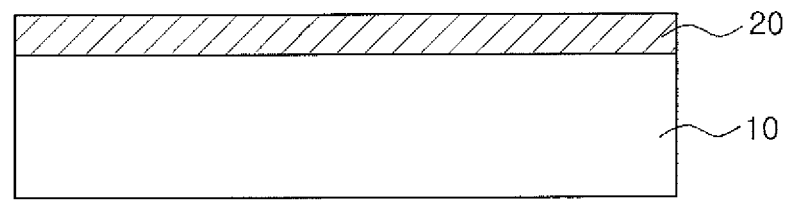
FIGS. 6 through 25 are cross-sectional or plan views illustrating a method of manufacturing a semiconductor light emitting device according to an exemplary embodiment of the inventive concept.

As shown in FIG. 6, the buffer layer 20 is formed on the substrate 10. However, in an exemplary embodiment, the buffer layer 20 may be omitted.

Figure 7:
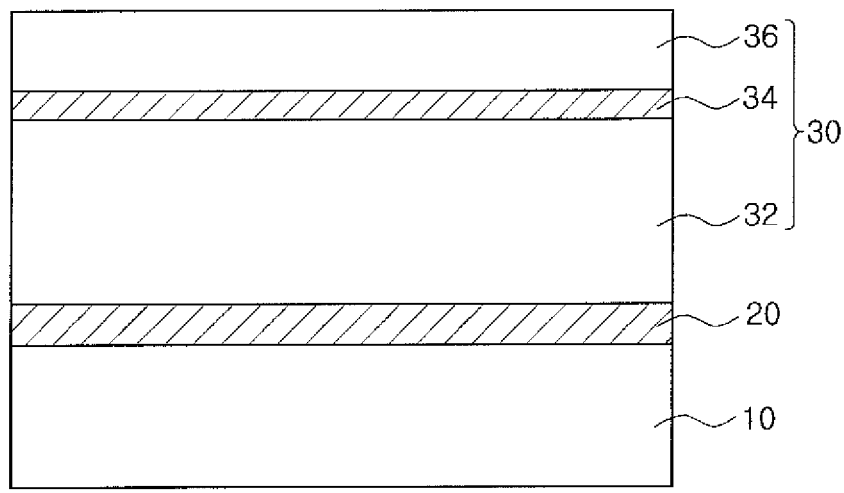

Next, with reference to FIG. 7, the light emitting structure 30 including the first conductivity-type semiconductor layer 32, the active layer 34 and the second conductivity-type semiconductor layer 36, is formed on the buffer layer 20.

Figure 8:
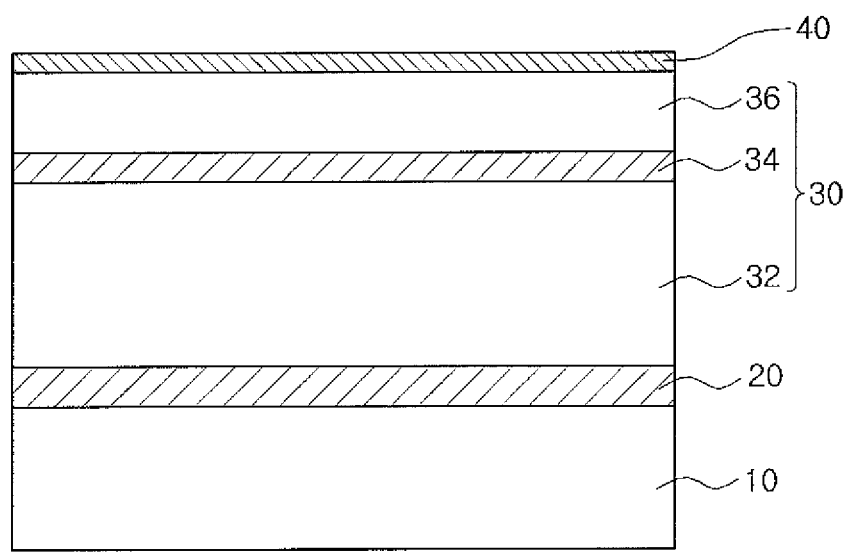

Next, with reference to FIG. 8, the current diffusion layer 40 is formed on the second conductivity-type semiconductor layer 36. The current diffusion layer 40 may include a transparent conductive material such as ITO, CIO, ZnO or the like.

Figure 9:
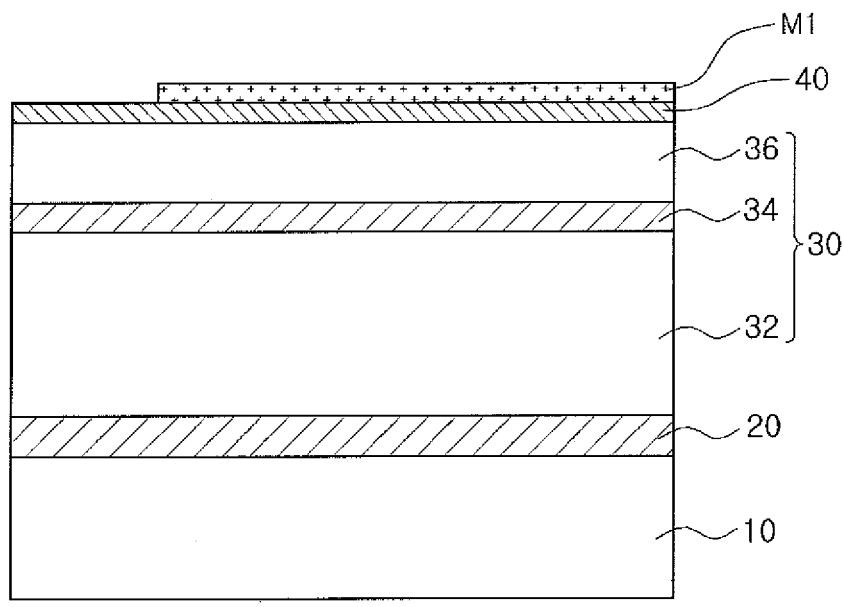
Figure 11:
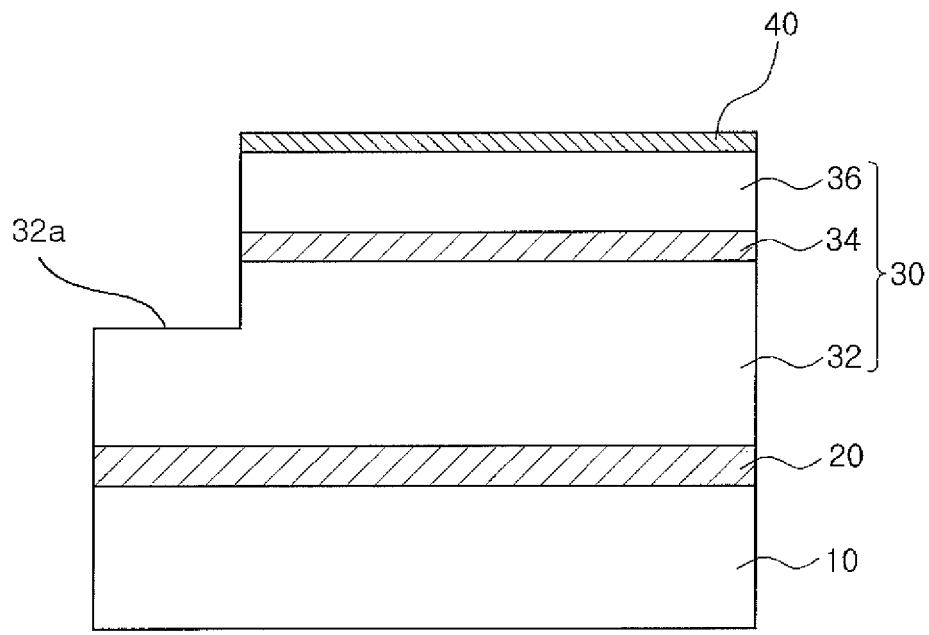

Next, with reference to FIG. 9, a first mask M1 is formed on the current diffusion layer 40. The first mask M1 is provided to define an area 32a, as shown in FIG. 11, on which the first electrode is to be formed.

The first mask M1 may be formed by a photolithography process or the like.

Using the first mask M1, the active layer 34, the second conductivity-type semiconductor layer 36 and the current diffusion layer 40 are etched. The first conductivity-type semiconductor layer 32 is partially etched to provide the area 32a on which the first electrode is to be formed.

The second conductivity-type semiconductor layer 36, the current diffusion layer 40, and the active layer 34 may be etched by using different etching solutions according to materials and thicknesses of the active layer 34, the second conductivity-type semiconductor layer 36 and the current diffusion layer 40. For example, a wet-etching process may be performed using acid chemicals or base chemicals.

Figure 10:
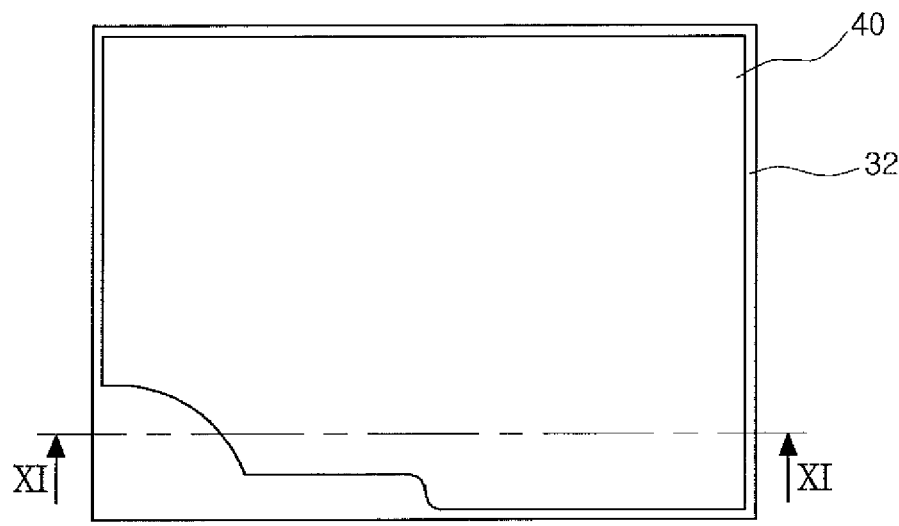

FIG. 10 is a schematic plan view after the portions of the active layer 34, the second conductivity-type semiconductor layer 36 and the current diffusion layer 40 are etched. FIG. 11 is a cross-sectional view taken along line XI-XI of FIG. 10.

As shown in FIGS. 10 and 11, the area 32a of the first conductivity-type semiconductor layer 32 is exposed by etching the active layer 34, the second conductivity-type semiconductor layer 36 and the current diffusion layer 40 using the first mask M1. As shown in FIG. 1, the first electrode 60 is formed on the area 32a.

FIGS. 12 through 16 are cross-sectional views, taken along line of FIG. 2, of illustrating a process of fabricating a semiconductor light emitting device according to an exemplary embodiment of the inventive concept.

Figure 12:
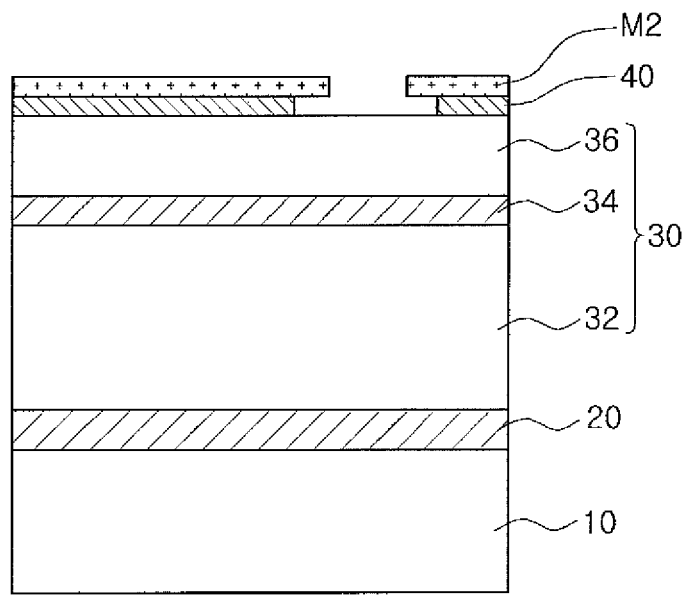

FIG. 12 shows that a second mask M2 is formed on the current diffusion layer 40. The current diffusion layer 40 exposed by the second mask M2 is partially etched to form the pad opening A and the finger opening B which expose the second conductivity-type semiconductor layer 36.

Figure 13:
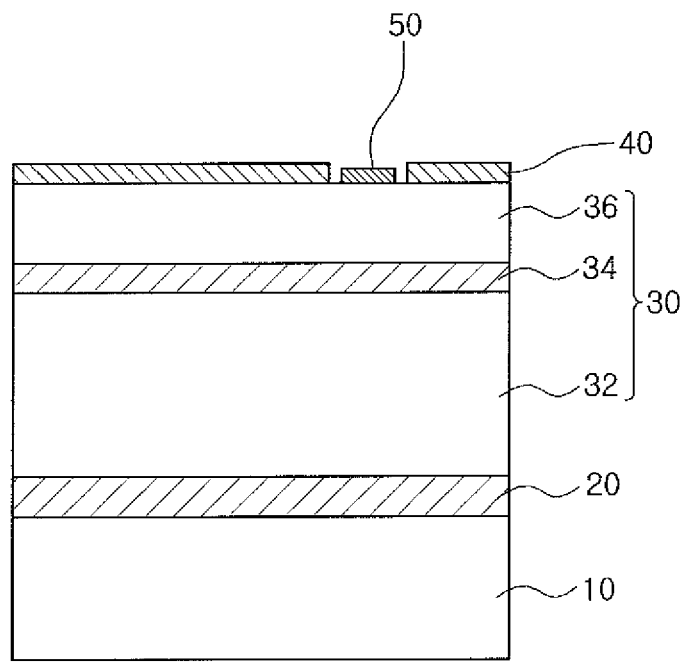

Next, with reference to FIG. 13, the reflective layer 50 is formed on the portions of the first and second conductivity-type semiconductor layers 32 and 36 exposed by the pad opening A and the finger opening B. The reflective layer 50 is formed within the pad opening A without being in contact with the current diffusion layer 40.

For example, when the pad opening A is formed by etching the current diffusion layer 40 in a wet-etching process using the second mask M2 as a etch mask, the pad opening A includes an undercut portion formed under the second mask M2. Thereafter, when the reflective layer 50 is formed using the second mask M2, the reflective layer 50 is formed inside the pad opening A without contacting the current diffusion layer 40. For example, the reflective layer 50 may be formed using a physical vapor deposition such as a sputtering process having low step coverage.

Figure 14:
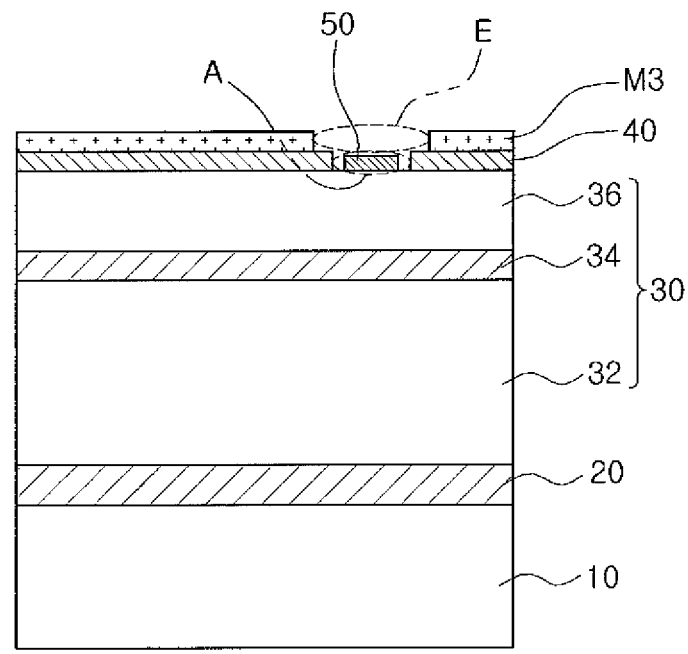

Next, with reference to FIG. 14, a third mask M3 for forming the first and the second electrodes is formed on the light emitting structure 30 including the current diffusion layer 40 formed thereon.

The third mask M3 is formed to have an opening E larger than the pad opening A formed in the current diffusion layer 40.

Figure 15:
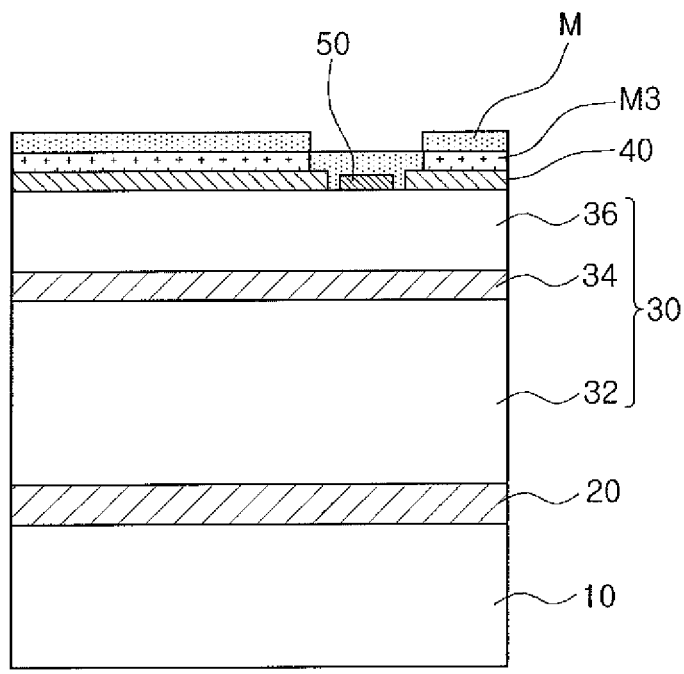

Next, with reference to FIG. 15, a metallic layer M is deposited on the third mask M3 to form the first and second electrodes 60 and 70.

The metallic layer M may include a metal having high electrical conductivity. The metallic layer M may be formed by a plating process, a sputtering process, a deposition process or the like.

Figure 16:
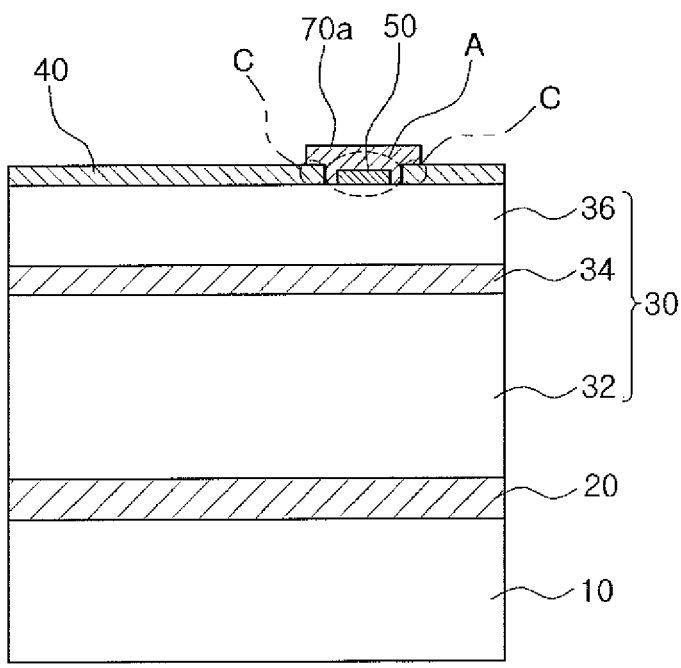

Next, with reference to FIG. 16, the third mask M3 having the metallic layer M deposited thereon is removed and the first and second electrodes 60 and 70 are formed.

Therefore, the second pad portion 70a of the second electrode 70 and the current diffusion layer 40 are in contact with each other along the circumference of the pad opening A of the current diffusion layer 40.

FIGS. 17 through 21 are cross-sectional views, taken along line IV-IV of FIG. 2, of illustrating a process of fabricating a semiconductor light emitting device according to an exemplary embodiment of the inventive concept.

Figure 17:
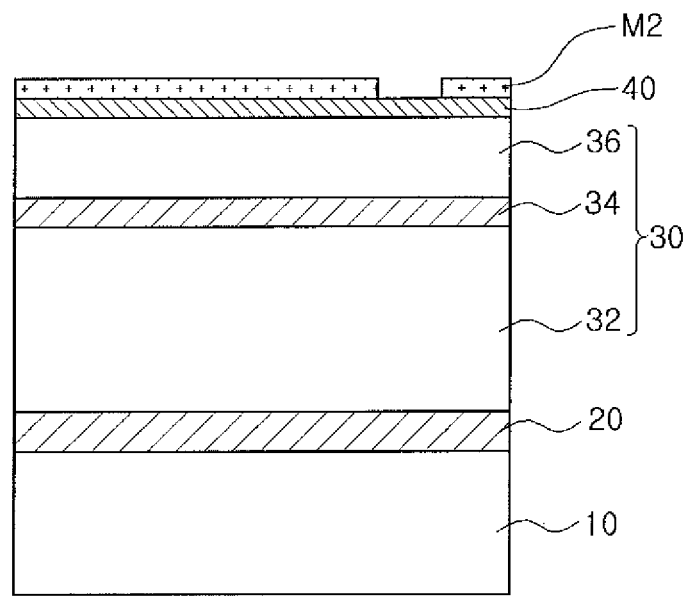

With reference to FIG. 17, using the same process as illustrated in FIG. 12, the second mask M2 is formed on the current diffusion layer 40. The second mask M2 defines and exposes an area of the current diffusion layer 40 in which the finger opening B is to be formed.

Figure 18:
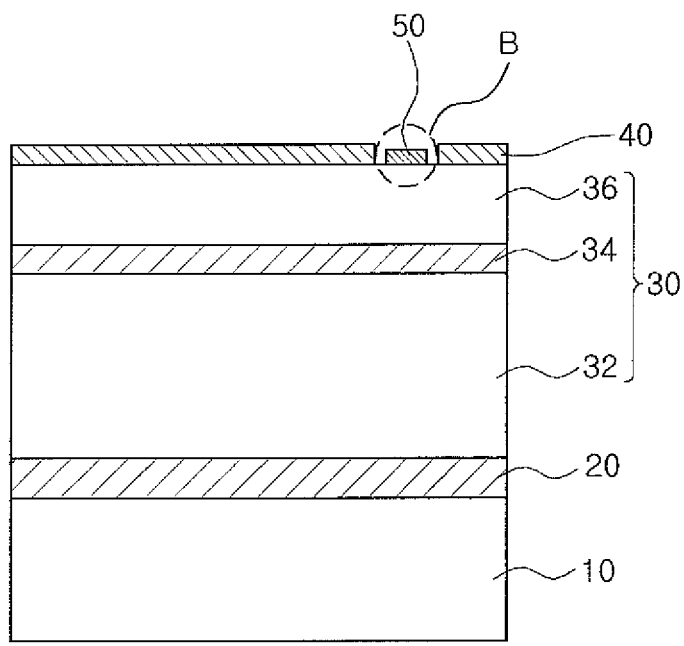

Next, with reference to FIG. 18, the finger opening B is formed by partially etching the exposed current diffusion layer 40 using the second mask M2 as an etch mask. The width of the finger opening B is greater than that of the second finger portion 70b of the second electrode 70, and the length of the finger opening B is shorter than that of the second finger portion 70b of the second electrode 70.

Then, the reflective layer 50 is formed on the portion of the second conductivity-type semiconductor layer 36 exposed by the finger opening B. The reflective layer 50 is formed within the finger opening B without being in contact the current diffusion layer 40.

For example, when finger opening B is formed by etching the current diffusion layer 40 in a wet etching process using the second mask M2 as a etch mask, the finger opening B includes an undercut portion formed under the second mask M2. Thereafter, the reflective layer 50 is formed within the finger opening B using the second mask M2 without contacting the current diffusion layer 40. The reflective layer 50 may be formed by using a physical vapor deposition process such as a sputtering process having low step coverage.

Figure 19:
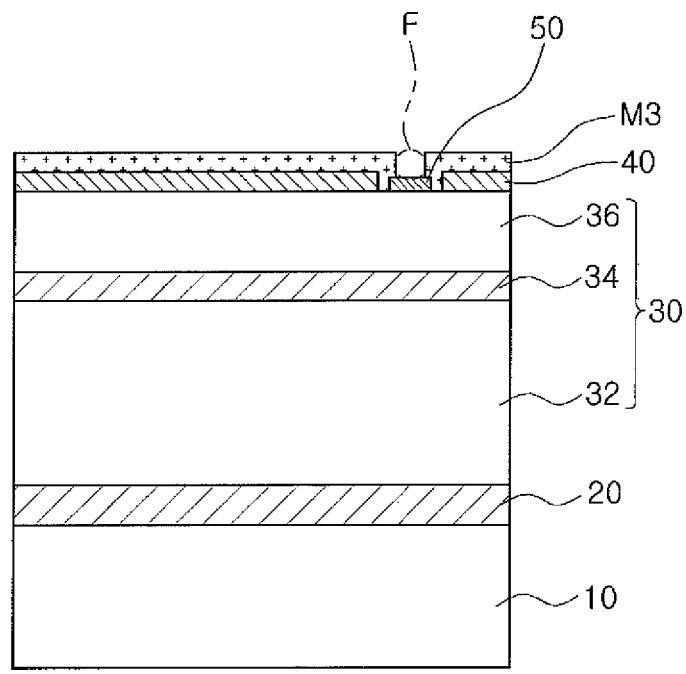

Next, with reference to FIG. 19, using the same process as illustrated in FIG. 14, the third mask M3 for forming the first and second electrodes is formed on the light emitting structure 30 including the current diffusion layer 40 formed thereon.

The third mask M3 includes an opening F smaller than the finger opening B formed in the current diffusion layer 40.

Figure 20:
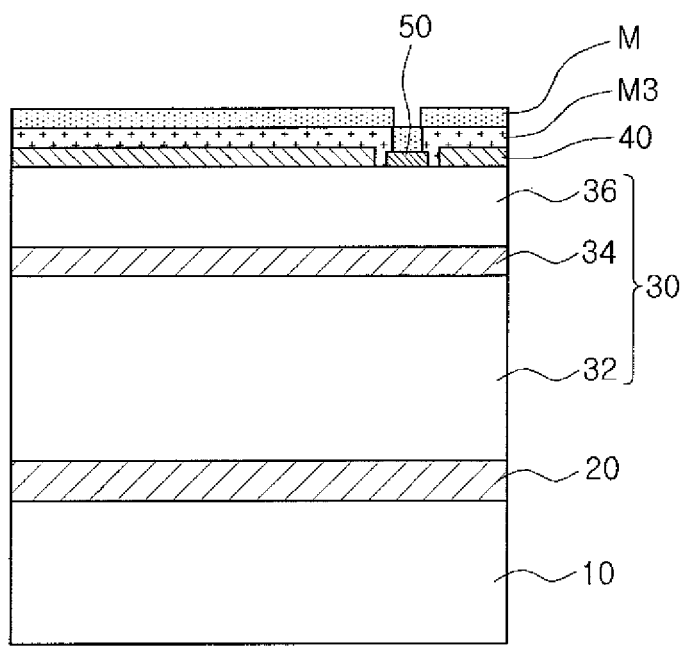

Next, with reference to FIG. 20, a metallic layer M is deposited on the third mask M3 to form the second electrode 70.

The metallic layer M may include a metal having high electrical conductivity by a plating process, a sputtering process, a deposition process or the like.

Figure 21:
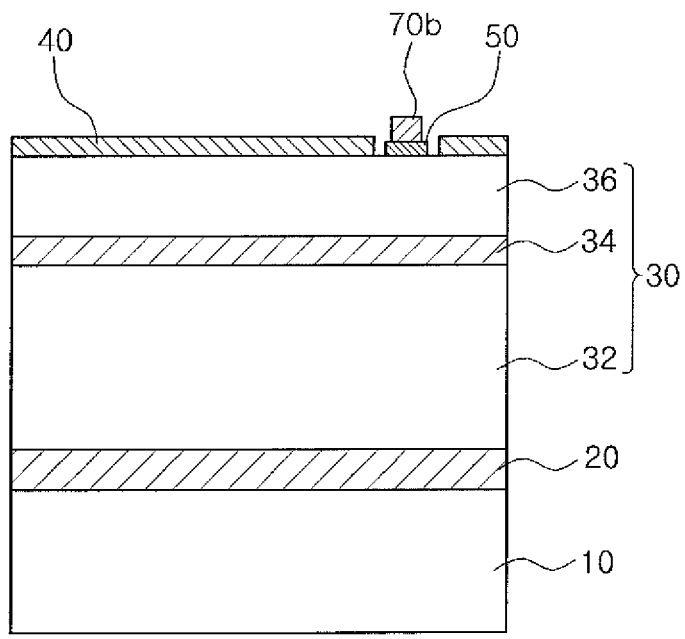

Next, with reference to FIG. 21, the third mask M3 having the metallic layer M deposited thereon is removed to form the second electrode 70.

Here, the second electrode 70 and the current diffusion layer 40 do not contact each other. The second electrode 70 is smaller than the reflective layer 50. In an exemplary embodiment, the second electrode 70 and the reflective layer 50 may have the same size, or one of them may be larger than the other.

FIGS. 22 through 25 are cross-sectional views, taken along line V-V of FIG. 2, illustrating a process of fabricating a semiconductor light emitting device according to an exemplary embodiment.

Figure 22:
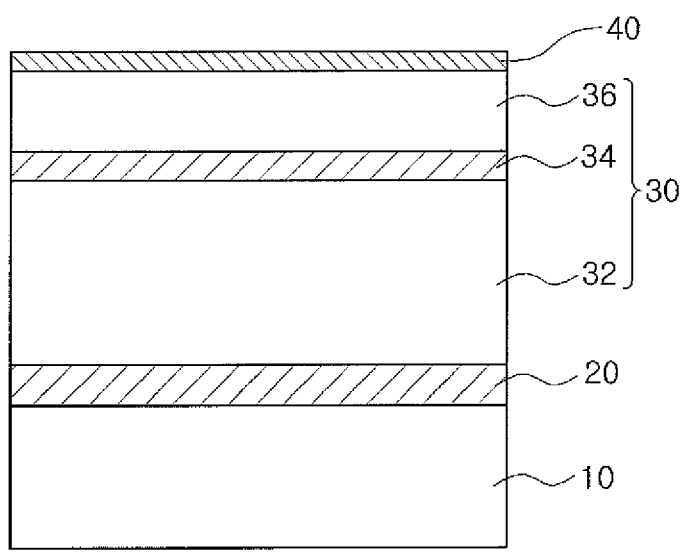

As shown in FIG. 22, the current diffusion layer 40 is formed on the second conductivity-type semiconductor layer.

Figure 23:
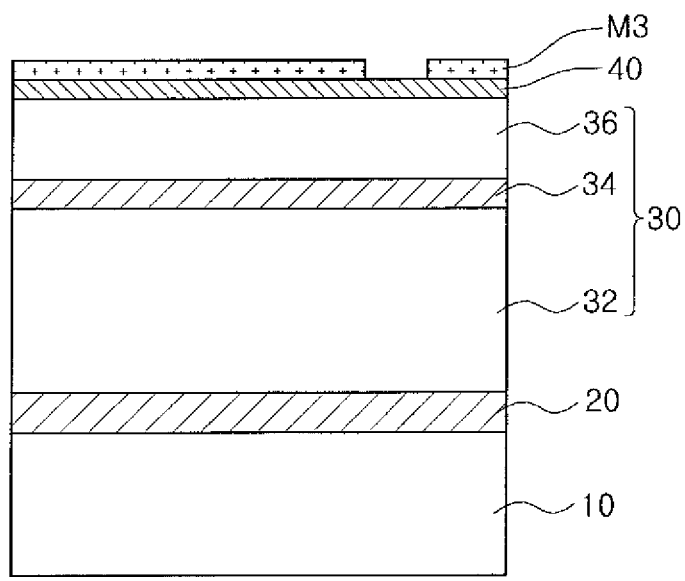

Next, with reference to FIG. 23, using the same process as illustrated in FIG. 14, the third mask M3 for forming the second electrode is formed on the current diffusion layer 40.

Figure 24:
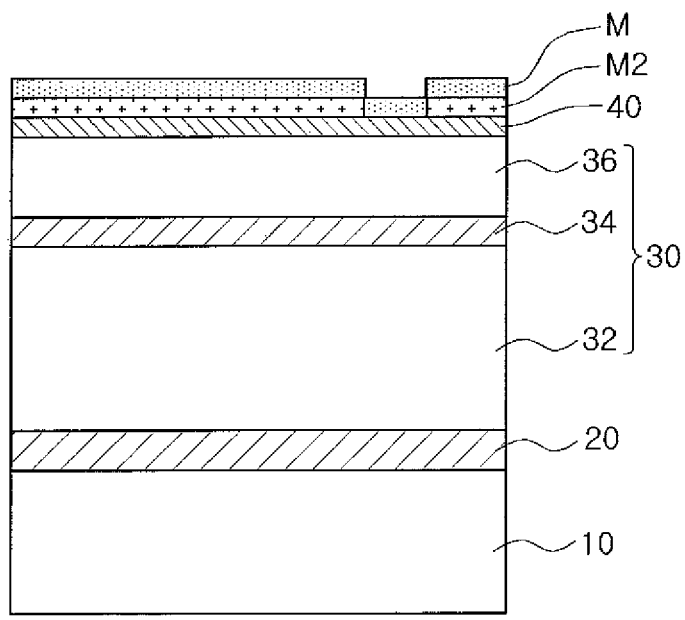

Next, with reference to FIG. 24, the metallic layer M is deposited on the third mask M3 to form the second electrode 70.

The metallic layer M may include a metal having high electrical conductivity by a plating process, a sputtering process, a deposition process or the like.

Figure 25:
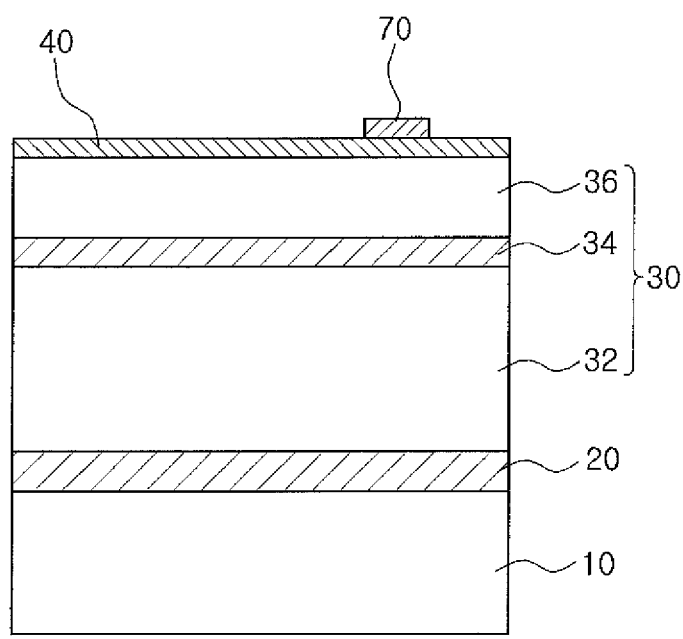

Next, with reference to FIG. 25, the third mask M3 having the metallic layer M deposited thereon is removed to form the second electrode 70. Since the current diffusion layer 40 is in contact with the second electrode 70, the current diffusion layer 40 serves to laterally spread current directed to the second electrode 70.

Next, although not shown, an insulating layer is formed to cover the light emitting structure including the first and the second electrodes 60 and 70 formed thereon. Then, a photolithography process is performed to expose the first and second pad portions 60*a* and 70*a* of the first and the second electrodes 60 and 70, respectively.

According to an exemplary embodiment, the second electrode 70 is in contact with the current diffusion layer 40 and the second conductivity-type semiconductor layer 36, and thus current directed, through the second electrode 70, to the second conductivity-type semiconductor layer 36 is laterally spread over the second conductivity-type semiconductor layer 36 by the current diffusion layer 40. For example, the current diffusion layer 40 serves to laterally spread the current directed to the second electrode 70 and to reduce current crowding on the lower area of the second electrode 70. The lateral spreading of current over the second conductivity-type semiconductor layer 36 increases the light uniformity of the semiconductor light emitting device.

When the current is prevented from being concentrated (or crowded) on the lower area of the second electrode 70, the semiconductor light emitting device 100 operates at a lower operating voltage.

Figure 26:
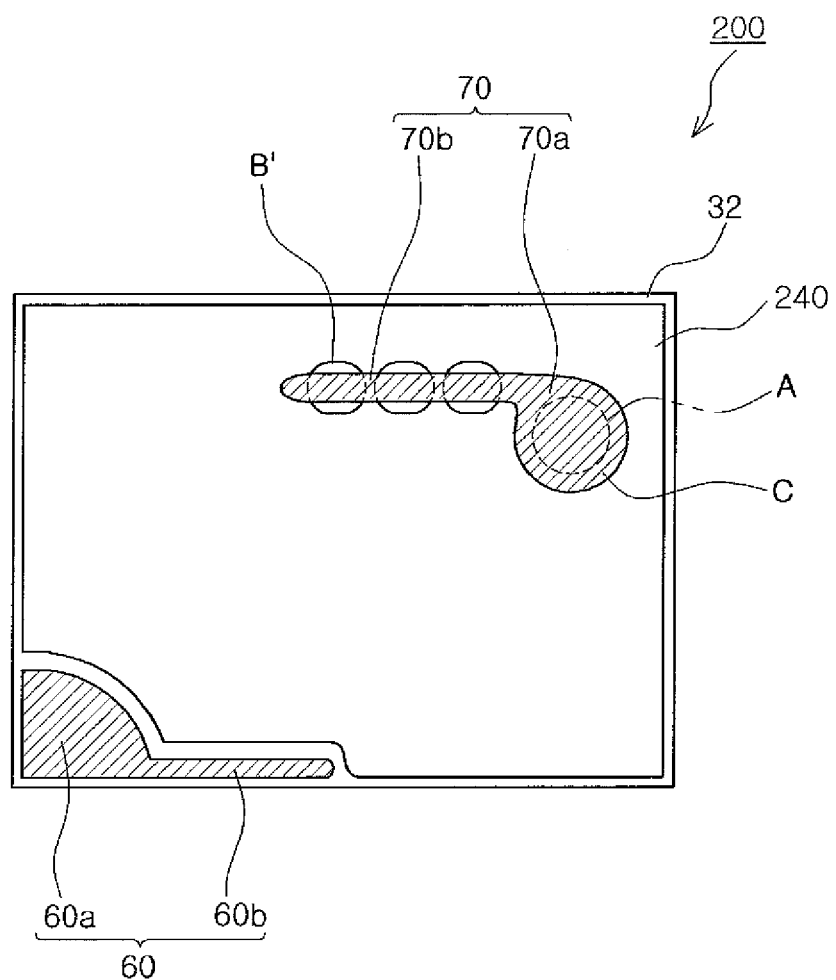
FIG. 26 is a schematic plan view of a semiconductor light emitting device according to an exemplary embodiment of the inventive concept.

FIG. 26 is a schematic plan view of a semiconductor light emitting device according to an exemplary embodiment of the inventive concept. The semiconductor light emitting device 200 of FIG. 26 is substantially similar to the semiconductor light emitting device 100 of FIG. 2, except for a current diffusion layer 240.

As shown in FIG. 26, the current diffusion layer 240 includes three finger openings B'. The three finger openings B' are spaced apart from each other. The number of the finger openings B' is not limited thereto, and may be two or more than three. Further description will be directed to the difference, and the description on the same elements will be omitted.

For example, the finger opening B' formed in the current diffusion layer 140 includes three openings. The second finger portion 70*b* of the second electrode 70 and the current diffusion layer 240 are in contact with each other through the finger openings B'.

Therefore, current directed to the second conductivity-type semiconductor layer 36 through the second electrode 70 is laterally spread over second conductivity-type semiconductor layer 36 by the current diffusion layer 240.

In an exemplary embodiment, the contact areas between the second finger portion 70*b* of the second electrode 70 and the current diffusion layer 240 may be increased. When the contact areas, as shown in FIG. 26, are separated from each other, the current is more effectively spread, and thus the light uniformity of the semiconductor light emitting device is creased.

Figure 27:
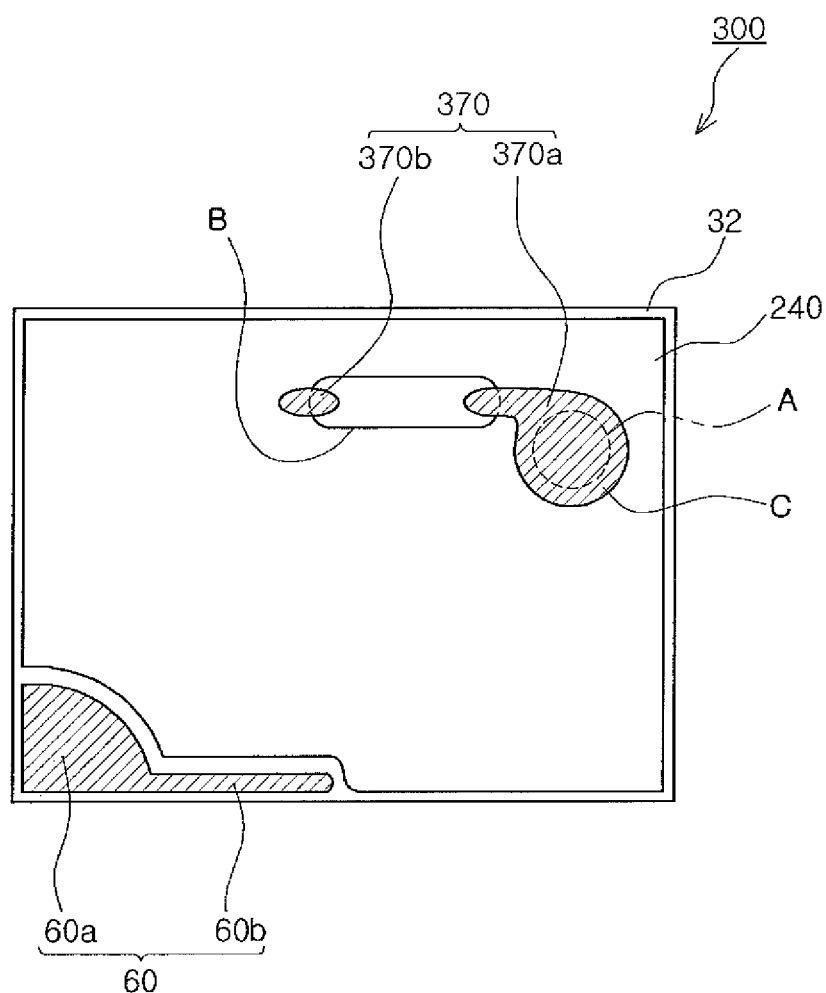
FIG. 27 is a schematic plan view of a semiconductor light emitting device according to an exemplary embodiment of the inventive concept.

FIG. 27 is a schematic plan view of a semiconductor light emitting device according to an embodiment of the present invention. The semiconductor light emitting device 300 is substantially similar to the semiconductor light emitting device 100 of FIG. 2, except for a second electrode 170'. Further description will be directed to the difference, and the description on the same elements will be omitted.

In the semiconductor light emitting device 300, a second finger portion 370*b* of the second electrode 370 is formed at one both ends of the finger opening B. The second finger portion 370 includes two portions spaced apart from each other. The detached portion from a body portion 370*a* which covers the pad opening A receives current from the second conductivity-type semiconductor layer 36 and spread the current over the second conductivity-type semiconductor layer 36 by the current diffusion layer 40.

As described above, a second electrode may have various shapes of a finger portion and/or a finger opening of a current diffusion layer may have various shapes when the second finger portion of the second electrode is in direct contact with a second conductivity-type semiconductor layer exposed by the finger opening.

A semiconductor light emitting device according to an exemplary embodiment may be used in various technical fields.

Figure 28:
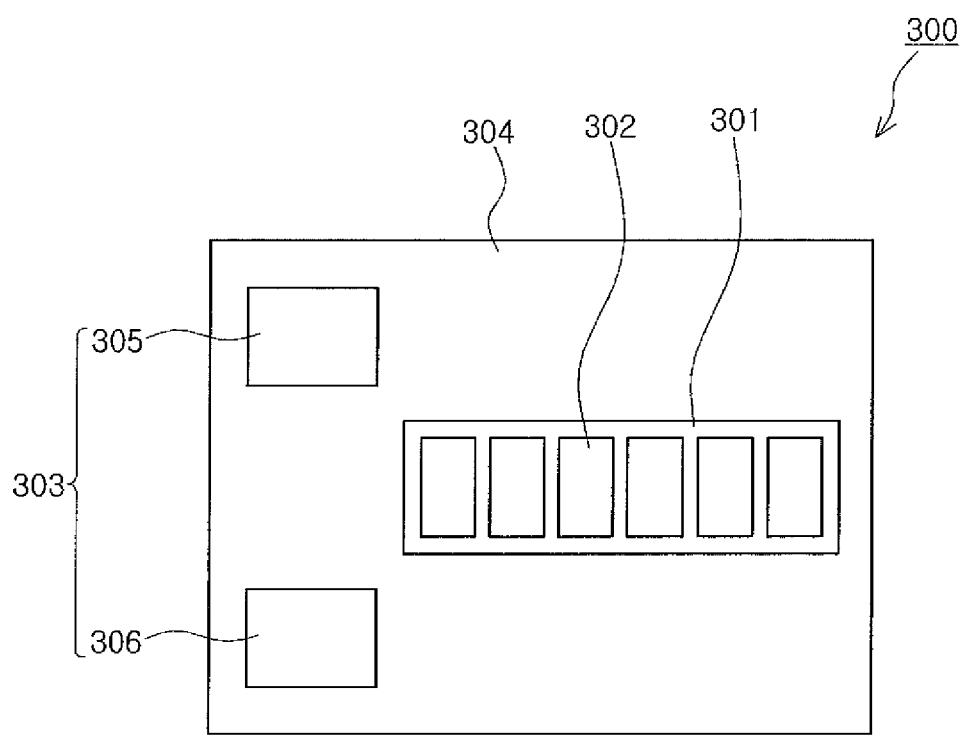
FIG. 28 is a view illustrating the exemplary usage of a semiconductor light emitting device according to an exemplary embodiment of the inventive concept.

FIG. 28 is a view illustrating the exemplary usage of a semiconductor light emitting device according to an exemplary embodiment of the inventive concept. With reference to FIG. 28, an illumination apparatus 300 includes a light emitting module 301, a structure 304 having the light emitting module disposed thereon, and a power supply unit 303. One or more semiconductor light emitting devices 302 according to an exemplary embodiment of the inventive concept are disposed on the light emitting module 301. For example, the semiconductor light emitting devices 302 may be individually mounted on the light emitting module 301 or may be provided as a package. The power supply unit 303 includes an interface part 305 receiving power and a power controlling part 306 controlling power supply to the light emitting module 30L The interface part 305 may include a fuse blocking over-current and an electromagnetic interference (EMI) filter shielding EMI signals.

When receiving AC power as an input power, the power controlling part 306 may include a rectifier converting the AC power into DC power, and a constant voltage controller converting the DC power into a voltage suitable for the light emitting module 301. For example, when the power supply unit is a DC power source (for example, a battery) having a voltage suitable for the light emitting module 301, the rectifier and the constant voltage controller may be omitted. For example, when the light emitting module 301 employs AC-LEDs, AC power may be directly supplied to the light emitting module 301 and thus, the rectifier and the constant voltage controller may be omitted. Furthermore, the power controlling part may control color temperature or the like, and a variety of illumination levels may be achieved according to human sensitivity. The power supply unit 303 may further include a feedback circuit comparing the amount of light emitted from the light emitting devices 302 with a predetermined amount of light and a memory storing information about desired luminance, color rendering, and the like.

The illumination apparatus 300 may be used as a backlight unit or a lamp used in a display device such as a liquid crystal display (LCD) device having a display panel, an indoor lighting device such as a flat panel lighting device or the like, and an outdoor lighting device such as a street light, an electric sign or the like. The illumination apparatus 300 may also be used in a variety of lighting devices for a vehicle such as a car, a ship, an airplane or the like. Furthermore, the illumination apparatus 300 may be used in a home appliance such as a TV or a refrigerator, medical equipment, and the like.

As set forth above, in a semiconductor light emitting device according to an exemplary embodiment of the inventive concept, a phenomenon in which current is concentrated on a localized area thereof is significantly reduced, and thus light uniformity is increased and an operating voltage is reduced.

In addition, a simplified manufacturing process of a semiconductor light emitting device according to an exemplary embodiment reduces manufacturing costs of the semiconductor light emitting device.

While the present inventive concept has been shown and described with reference to exemplary embodiments thereof, it will be apparent to those of ordinary skill in the art that various changes in form and detail may be made therein without departing from the sprit and scope of the inventive concept as defined by the following claims.

What is claimed is:

1. A semiconductor light emitting device comprising:
a first conductivity type semiconductor layer, an active layer and a second conductivity-type semiconductor layer sequentially stacked on a substrate;
a first electrode disposed on a portion of the first conductivity-type semiconductor layer;
a current diffusion layer disposed on the second conductivity-type semiconductor layer and including an opening;
a second electrode disposed on a portion of the current diffusion layer and an exposed portion defined by the opening of the current diffusion layer; and
a reflective layer interposed between the second electrode and the second conductivity-type semiconductor layer and spaced apart from the current diffusion layer,
wherein the portion of the current diffusion layer is near the opening.

2. The semiconductor light emitting device of claim 1 wherein the second electrode includes a pad portion and a finger portion extending from the pad portion.

3. The semiconductor light emitting device of claim 2 wherein the finger portion is narrower than the pad portion.

4. The semiconductor light emitting device of claim 2 wherein the opening includes a pad opening and a finger opening apart from each other, wherein the pad and finger portions of second electrode are connected to the second conductivity-type semiconductor layer through the pad and finger openings, respectively.

5. The semiconductor light emitting device of claim 4 wherein the pad portion covers the pad opening and partially a portion of the current diffusion layer around the pad opening, the finger portion partially covers the finger opening and covers a portion of the current diffusion layer at an end of the opening.

6. The semiconductor light emitting device of claim 4 wherein the pad opening smaller than the pad portion of the electrode, and wherein the finger opening is elongated in a direction, wherein the finger opening is wider in a second crossing the first direction than the finger portion of the electrode and is shorter in the first direction than the finger portion of the second electrode.

7. The semiconductor light emitting device of claim 4 wherein the pad opening is smaller than the pad portion of the electrode, and wherein the finger opening includes a plurality finger openings spaced apart from each other along a first wherein each of the plurality of finger openings is wider in a direction crossing the first direction than the finger portion the second electrode and is shorter in the first direction than finger portion of the second electrode.

8. The semiconductor light emitting device of claim 1 wherein the current diffusion layer includes a transparent conductive oxide including ITO, CIO, or ZnO.

9. The semiconductor light emitting device of claim 1 further comprising:
another reflective layer disposed under the first electrode.

10. The semiconductor light emitting device of claim 1 wherein the second electrode is directly connected to the second conductivity-type semiconductor layer through the opening.

11. The semiconductor light emitting device of claim 1 wherein the portion of the current diffusion, layer covered by second electrode surrounds the opening of the current diffusion layer.

12. The semiconductor light emitting device of claim 2 wherein the finger portion includes at least two finger portions spaced apart from each other in a direction that he finger is elongated, wherein one of the at least two finger portions is connected to the second conductivity-type semiconductor layer at first side of the finger opening and the other of the at least finger portions is connected to the second conductivity-type semiconductor layer at a second side of the finger opening to the first side of the finger opening.

13. A semiconductor light emitting device comprising:
a substrate;
a first conductivity- type semiconductor layer disposed on the substrate and having a stepped surface;
an active layer disposed on an upper level of the stepped surface;
a second conductivity-type semiconductor layer disposed on the active layer;
a current diffusion layer disposed on the second conductivity-type semiconductor layer and including a first opening and a second opening;
a first electrode disposed on a lower level of the stepped surface; and
a second electrode covering the first and the second openings and partially covering the current diffusion layer near the first and the second openings,
wherein current flows from the second electrode to the Electrode.

14. The semiconductor light emitting device of claim 13 wherein the second opening is elongated along a first direction, wherein the second electrode includes a first portion extending the first direction on the exposed second conductivity-type semiconductor layer by the second opening and the current layer.

15. The semiconductor light emitting of claim 14, wherein the second electrode further includes a portion contacting the second conductivity-type semiconductor through the first opening and partially covering the current diffusion layer around the first opening.

16. The semiconductor light emitting device claim 14, wherein the second opening includes a plurality of spaced apart from each other along the first direction, the second electrode includes a first portion, extending along first direction, disposed on the exposed second, conductivity-semiconductor layer by the plurality of openings and the current diffusion layer.

17. The semiconductor light emitting device of claim 14 further comprising:
a reflective layer disposed within the first opening and disposed on the second conductivity-type semiconductor layer,
wherein the second. electrode covers the reflective layer.

18. The semiconductor light emitting device claim 14, wherein the current diffusion layer a transparent conductive oxide including ITO, CIO, or ZnO.

* * * * *